(12) United States Patent
Hong et al.

(10) Patent No.: US 10,319,839 B2
(45) Date of Patent: Jun. 11, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Zhong Shan Hong, Shanghai (CN); Ke Lu Hua, Shanghai (CN); Jin Peng, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/473,703

(22) Filed: Mar. 30, 2017

(65) Prior Publication Data

US 2017/0345916 A1    Nov. 30, 2017

(30) Foreign Application Priority Data

May 27, 2016  (CN) .......................... 2016 1 0362447

(51) Int. Cl.
 H01L 21/265    (2006.01)
 H01L 29/66    (2006.01)
(Continued)

(52) U.S. Cl.
 CPC ...... H01L 29/66795 (2013.01); H01L 21/265 (2013.01); H01L 21/3086 (2013.01);
(Continued)

(58) Field of Classification Search
 CPC . H01L 21/265; H01L 21/2652; H01L 21/306; H01L 21/3082; H01L 21/324;
(Continued)

(56) References Cited

U.S. PATENT DOCUMENTS 8,440,511 B1 * 5/2013 Liao ............... H01L 21/306
                                                     438/157
2004/0217433 A1   11/2004 Yeo et al.
(Continued)

FOREIGN PATENT DOCUMENTS

EP    1892765 A1    2/2008
EP    2423953 A1    2/2012

OTHER PUBLICATIONS

The European Patent Office (EPO) The Extended European Search Report for 17171963.6 dated Oct. 26, 2017 8 Pages.

*Primary Examiner* — Cuong Q Nguyen
(74) *Attorney, Agent, or Firm* — Anova Law Group, PLLC (57) ABSTRACT

A semiconductor structure and a method for fabricating a semiconductor structure are provided. The method includes forming one or more fins on a substrate, wherein each fin includes a first sidewall and a second sidewall opposing each other. The method also includes forming a sacrificial layer over the fin. Further, the method also includes performing a first ion implantation process on the first sidewall and a top of the fin, and performing a second ion implantation process on the second sidewall and the top of the fin.

15 Claims, 6 Drawing Sheets

(51) Int. Cl.
*H01L 21/308* (2006.01)
*H01L 21/324* (2006.01)
*H01L 21/8234* (2006.01)
*H01L 27/088* (2006.01)
*H01L 29/06* (2006.01)
*H01L 29/36* (2006.01)
*H01L 29/78* (2006.01)

(52) U.S. Cl.
CPC .... *H01L 21/324* (2013.01); *H01L 21/823431* (2013.01); *H01L 27/0886* (2013.01); *H01L 29/0649* (2013.01); *H01L 29/36* (2013.01); *H01L 29/66553* (2013.01); *H01L 29/66803* (2013.01); *H01L 29/785* (2013.01); *H01L 29/66818* (2013.01); *H01L 29/7854* (2013.01)

(58) Field of Classification Search
CPC ..... H01L 21/823431; H01L 21/823807; H01L 21/823821
See application file for complete search history.

(56) References Cited

U.S. PATENT DOCUMENTS

| | | |
|---|---|---|
| 2008/0085580 A1 | 4/2008 | Doyle et al. |
| 2009/0269918 A1 | 10/2009 | Ma et al. |
| 2010/0273322 A1 | 10/2010 | Papasouliotis et al. |
| 2011/0269282 A1* | 11/2011 | Kawasaki ........... H01L 21/2652 438/285 |
| 2016/0141387 A1 | 5/2016 | Tseng et al. |
| 2016/0358911 A1* | 12/2016 | Chen ............... H01L 21/823431 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610362447.2, filed on May 27, 2016, the entirety of which is incorporated herein by reference.

FIELD OF THE DISCLOSURE

The present disclosure generally relates to the field of semiconductor manufacturing and, more particularly, relates to a semiconductor structure and fabrication techniques thereof.

BACKGROUND

With the development of integrated circuit towards ultra-large scale integrated circuit, circuit density in the integrated circuit keeps increasing, the number of components included in the integrated circuit keeps increasing, and the size of the components decreases accordingly. With the decreasing of the size of metal-oxide-semiconductor (MOS) devices, channels of the MOS devices are shortened accordingly. Because the channel is shortened, the gradual channel approximation of the MOS devices is no longer valid, and varieties of adverse physical effects (especially the short-channel effect) become prominent. The device performance and reliability may degrade, limiting further reduction of the size of the devices.

To further reduce the size of the MOS devices, a multi-faceted-gate field effect transistor (FET) structure has been developed to improve the control capability of the gate on the MOS device, and to suppress the short-channel effect. Among them, a FinFET is one of common multifaceted-gate field effect transistors.

The FinFET has a three-dimensional structure. The Fin-FET includes a substrate, one or more protruding fins formed on the substrate, and an insulating structure disposed between the adjacent fins. The FinFET also includes a gate crossing the one or more fins to cover the top and side surfaces of the fins. Because the three-dimensional FinFET is significantly different from the conventional planar transistor, improper operations in some processes may cause a great impact on the electrical properties of the formed device.

The threshold voltage of the transistor can be adjusted by implanting the doping ions into the channel region of the transistor. For the FinFET, the channel of the transistor is formed inside each fin. It is difficult to perform an ion implantation process onto the fin of the FinFET and to control concentration of doping ions in the fin, thus impacting the performance of the formed FinFET. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes forming one or more fins on a substrate, wherein each fin includes a first sidewall and a second sidewall opposing each other. The method also includes forming a sacrificial layer over the fin. Further, the method also includes performing a first ion implantation process on the first sidewall and a top of the fin, and performing a second ion implantation process on the second sidewall and the top of the fin.

Another aspect of the present disclosure includes a semiconductor structure. The semiconductor structure includes one or more fins formed on a substrate, wherein each fin includes a first sidewall and a second sidewall opposing each other. The semiconductor structure also includes a doped layer formed in a top and sidewalls of each fin. Further, the semiconductor structure includes an isolation layer formed between the adjacent fins.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
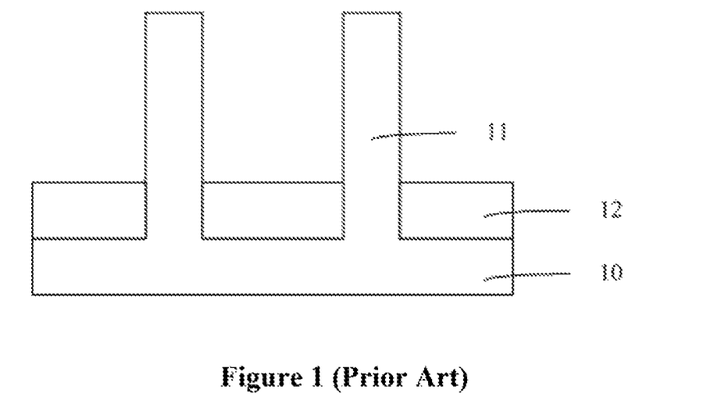
FIGS. 1-2 illustrate semiconductor structures corresponding to certain stages of an existing fabrication method of a semiconductor structure.
Figure 2:
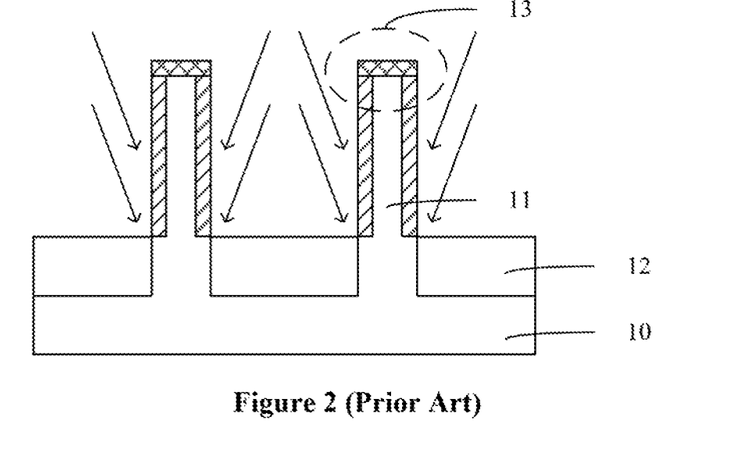

FIGS. 1-2 illustrate semiconductor structures corresponding to certain stages of an existing fabrication process of a semiconductor structure. Referring to FIG. 1, a substrate 10 is provided and one or more fins 11 are formed on the substrate. An isolation layer 12 is formed between the adjacent fins. The top surface of the isolation layer 12 is lower than the top surface of each fin 11, and a portion of sidewall of each fin 11 is exposed.

Referring to FIG. 2, an adjusting ion implantation process is performed on each fin to achieve adjustment of the threshold voltage of the FinFET. The adjusting ion implantation process can be achieved by performing the ion implantation process twice directly on the sidewall of each fin 11. When performing the adjusting ion implantation process, the top of each fin 11 is subject to the ion implantation process twice, therefore concentration of doped ions in the top of each fin 11 is higher than concentration of doped ions in the sidewall of each fin 11 (shown in the circle 13 in FIG. 2). It impacts the uniformity of the formed semiconductor structure and the performance of the formed semiconductor device.

Figure 9:
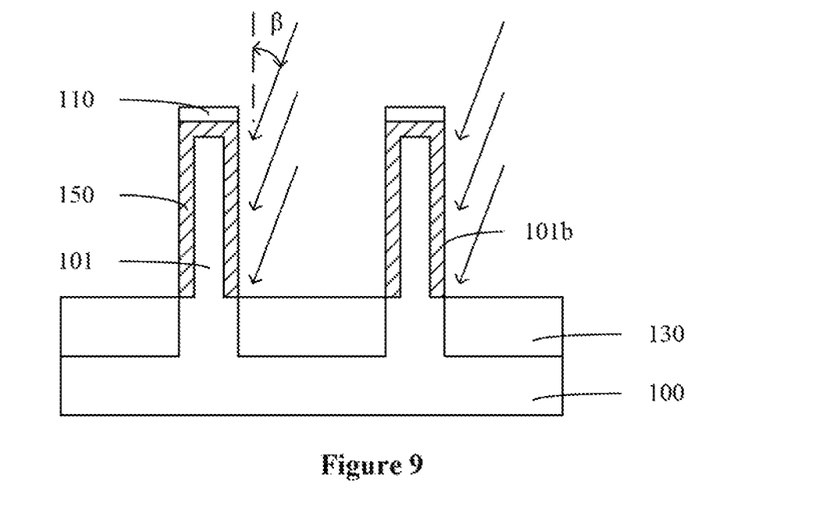
Figure 10:
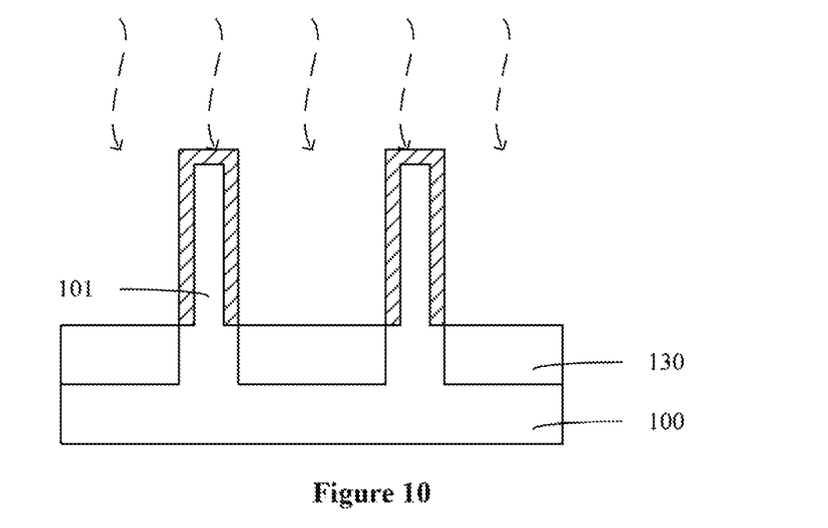
Figure 11:
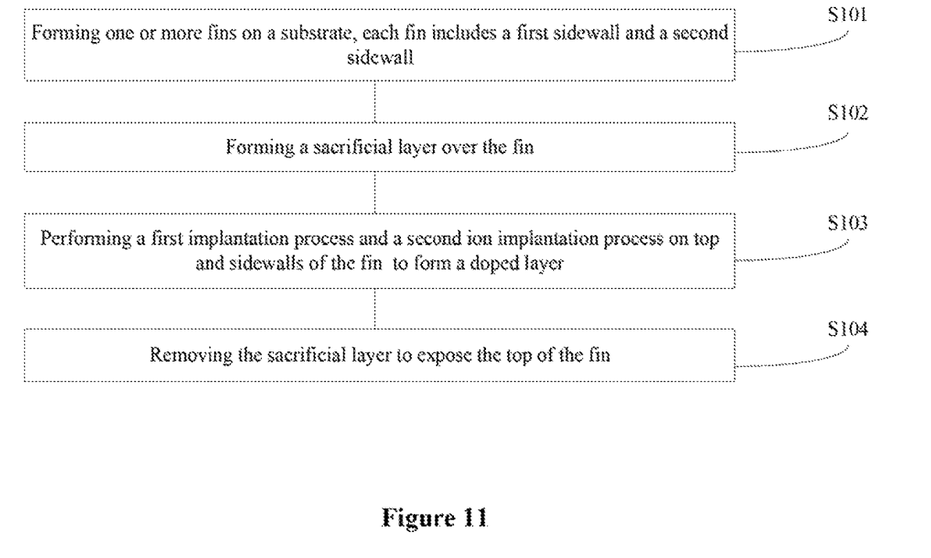
FIG. 11 illustrates an exemplary fabrication method to form a semiconductor structure consistent with various disclosed embodiments of the present disclosure.

The present disclosure provides a semiconductor structure and fabrication method. FIG. 11 illustrates an exemplary fabrication method to form a semiconductor structure consistent with the disclosed embodiments; and FIGS. 3-10 illustrate semiconductor structures corresponding to certain stages of the exemplary fabrication method.

Figure 3:
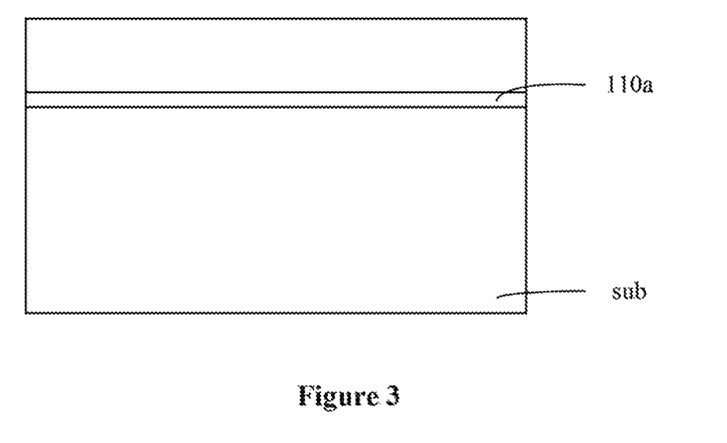
FIGS. 3-10 illustrate semiconductor structures corresponding to certain stages of a fabrication method of a semiconductor structure consistent with various disclosed embodiments of the present disclosure.
Figure 4:
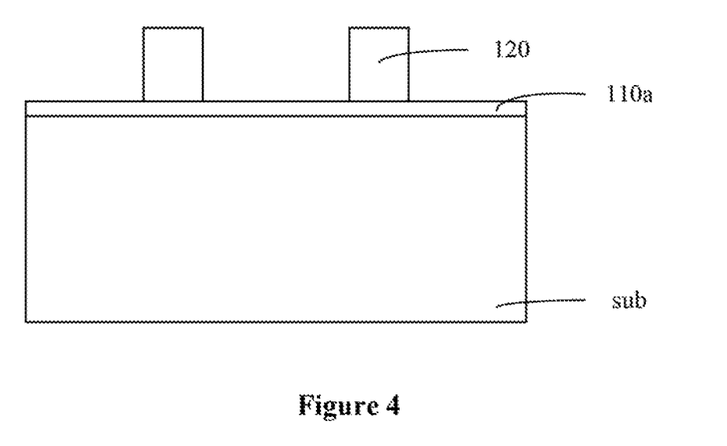
Figure 5:
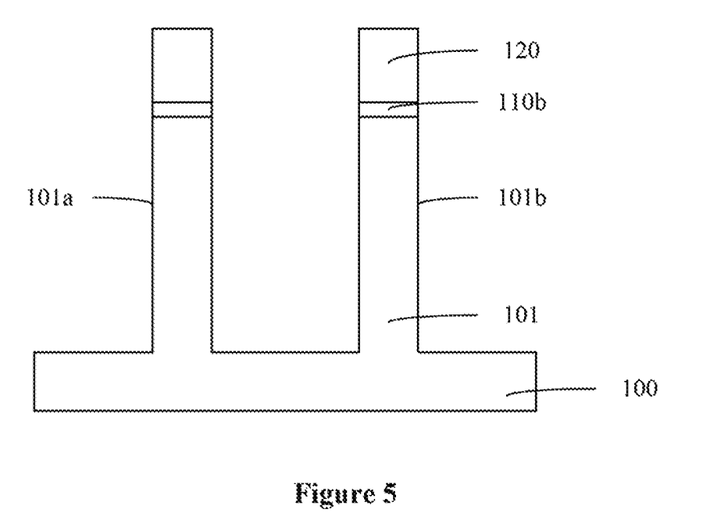

As shown in FIG. 11, at the beginning of the fabrication method, a substrate having a plurality of fins may be formed (S101). FIGS. 3-5 illustrate corresponding semiconductor structures.

Referring to FIG. 5, a substrate 100 having a plurality of fins 101 may be formed. The substrate 100 may provide a platform for subsequent semiconductor processes. The fins 101 may be configured to form a semiconductor structure.

As shown in FIG. 3, forming the substrate 100 may include providing a base substrate (sub). The base substrate (sub) may be configured to provide a platform for subsequent processes. The fins may be formed by etching the base substrate (sub). In one embodiment, the base substrate (sub) may be made of polysilicon, or amorphous silicon, etc. The base substrate may also be made of silicon, germanium, gallium arsenide or silicon germanium compound, etc. Further, the base substrate (sub) may be made of other semiconductor materials.

In certain other embodiments, silicon structure (not shown) having an epitaxial layer or on an epitaxial layer may be formed on the base substrate (sub). For example, a semiconductor layer may be formed on the base substrate (sub). The semiconductor layer may be formed by a selective epitaxial deposition process. The base substrate (sub) may include a silicon substrate, a germanium-silicon substrate, a silicon carbide substrate, a silicon on insulator substrate, a germanium on insulator substrate, a glass substrate, or Group III-V compounds substrates, such as a gallium nitride substrate, or a gallium arsenide substrate, etc. The semiconductor layer may be made of silicon, germanium, silicon carbide, or germanium silicon, etc. The materials of forming the substrate and the semiconductor layer are not limited. The substrate may be made of materials adapted to process requirements and easy integration, and the semiconductor layer may be made of materials adapted to forming the fin. The thickness of the semiconductor layer can be controlled by the epitaxial process, thus the height of the formed fin can be precisely controlled.

Referring to FIG. 3 and FIG. 4, a sacrificial material layer 110*a* may be formed on the base substrate (sub), and a mask layer 120 may be formed on the sacrificial material layer 110*a*. The mask layer 120 may be a patterned mask layer and configured to define the size and positions of the fins. In one embodiment, the mask layer 120 may include at least one silicon nitride layer. In certain other embodiments, the mask layer may be made of other semiconductor materials configured as an etching mask.

Forming the patterned mask layer 120 may include forming a mask material layer on the sacrificial material layer 110*a*; and patterning the mask material layer to form the patterned mask layer 120. The mask layer may also be formed by etching the mask material layer. In one embodiment, the mask material layer may include at least one silicon nitride layer. Correspondingly, the mask layer may include at least one silicon nitride layer. The mask material layer may be formed on the sacrificial material layer 110*a* by a chemical vapor deposition, a physical vapor deposition, an atomic layer deposition, a furnace tube process, or other film deposition processes.

To reduce the feature dimension of the fins and the distance between the adjacent fins, the patterned mask layer 120 may be formed by a multiple patterning process. The multiple patterning process may include a self-aligned double patterned (SaDP) process, a self-aligned triple patterned (SaTP) process, or a self-aligned double double patterned (SaDDP) process, etc.

It The multiple patterning process is an exemplary process used to form the patterned mask layer. In other embodiments, the mask layer 120 may be made of photoresist and be formed by coating and photolithography processes. Other suitable processes may also be used to form the mask layer.

A sacrificial layer may be formed by etching the sacrificial material layer 110*a*. The sacrificial material layer 110*a* may be formed on the base substrate (sub) by a chemical vapor deposition, a physical vapor deposition, an atomic layer deposition, a furnace tube process, or other film deposition processes. In one embodiment, the sacrificial material layer 110*a* may be made of silicon oxide. In certain other embodiments, the sacrificial material layer 110*a* may be made of germanium-silicon, or germanium, etc.

Referring to FIG. 5, the substrate 100 and the fins 101 may be formed by using the mask layer 120 as a mask to etch the sacrificial material layer 110*a* and the base substrate (sub). In one embodiment, the process of forming the substrate 100 and the fins 101 may be a dry etching process. For example, the substrate 100 and the fins 101 may be formed by an anisotropic dry etching process. After forming the substrate 100 and the fins 101, remaining sacrificial material layer 110*b* may be retained between the mask layer 120 and the top of the fins 101.

Each fin 101 may include a first sidewall 101*a* and a second sidewall 101*b* opposing each other and parallel to a length direction of the fin 101. The first sidewall 101*a* and the second sidewall 101*b* may be perpendicular or inclined to the surface of the substrate 100. In one embodiment, the first sidewall 101*a* and the second sidewall 101*b* may be perpendicular to the surface of the substrate 100, therefore the bottom size and the top size of each fin 101 are equal. In certain embodiments, the first sidewall 101*a* and the second sidewall 101*b* may be inclined to the surface of the substrate 100, therefore the bottom size of each fin 101 is larger than the top size of each fin 101.

When forming the fins 101, damages or minor roughness may occur to the surface of the etched substrate 100. To repair the damages or roughness on the surface of the substrate 100, and to improve performance of the semiconductor structure, in one embodiment, after forming the fins, a liner oxide layer (not shown) may be formed on the surfaces of the substrate 100 and the fins 101. The liner oxide layer may smooth sharp corners on the surfaces of the substrate 100 and the fins 101, and act as a buffer layer between the subsequently formed film layer and the substrate 100 and the fins 101 to reduce the lattice mismatch thereof. For example, the liner oxide layer may be formed by a chemical vapor deposition process, or a thermal oxidation process, etc. In certain embodiments, the liner oxide layer may not be formed. The damages may be repaired by performing an annealing process on the substrate 100 and the fins 101.

Figure 6:
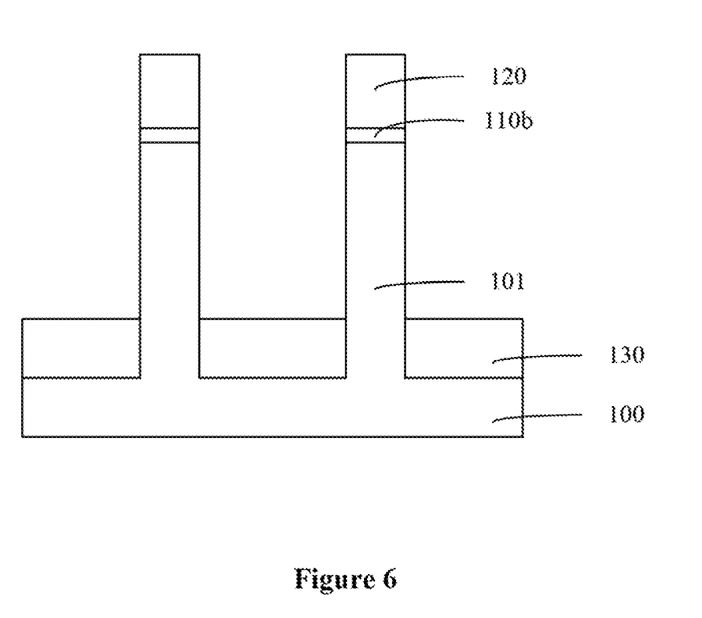
Figure 7:
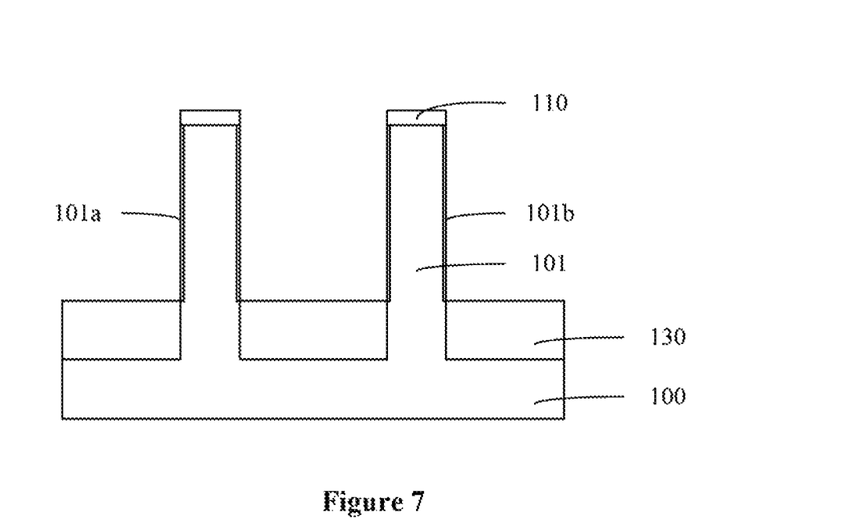

Returning to FIG. 11, after forming one or more fins on the substrate, a sacrificial layer may be formed (S102). FIGS. 6-7 illustrate corresponding semiconductor structures.

Referring to FIG. 7, a sacrificial layer 110 may be formed on the top of each fin 101. As shown in FIG. 6, in one embodiment, after forming the substrate 100 and before forming the sacrificial layer 110, an isolation layer 130 may be formed between the adjacent fins 101. The isolation layer 130 may provide electrical isolation between the adjacent fins 101. In one embodiment, the isolation layer 130 may be made of silicon oxide, silicon nitride, or other dielectric materials. The isolation layer 130 may be formed by a chemical vapor deposition process.

For example, forming the isolation layer 130 may include filling dielectric material between the adjacent fins, where the top surface of the dielectric material may be above the top surface of each fin 101; and removing a thickness portion of the dielectric material to expose part of the sidewall of each fin 101. In one embodiment, the mask layer 120 may cover the top surface of each fin 101. Therefore, the dielectric material may also cover the top surface of the mask layer 120.

With the reduction of device size and the increasing of device density, the distance between the adjacent fins may be narrowed. Forming the isolation layer 130 may include performing a flowable chemical vapor deposition (FCVD) process to fill a space between the adjacent fins 101. The isolation layer 130 may fill up the space between the adjacent fins 101, and reduce the occurrence of holes in the isolation layer.

For example, forming the isolation layer 130 by the flowable chemical vapor deposition (FCVD) process may include forming a precursor to cover the substrate 100, the fins 101 and the surface of the mask layer 120. The precursor may be in a fluid state, and the surface of the precursor may be above the surface of the mask layer 120. Forming the isolation layer 130 by the flowable chemical vapor deposition (FCVD) process may also include performing an annealing process to solidify the precursor to form the isolation layer 130.

After filling the space between the adjacent fins with the dielectric material, a thickness portion of the dielectric material may be removed to expose part of the sidewall of the fins 101. For example, removing the thickness portion of the dielectric material may include: performing a chemical mechanical polishing process to planarize the dielectric material until the top surface of the dielectric material is coplanar with the top surface of the mask layer 120; and performing a back-etching process on the remaining dielectric material to expose part of the sidewall of the fins 101.

Referring to FIG. 7, the sacrificial layer 110 may be formed on the top of each fin 101. For example, the sacrificial layer 110 may be formed by removing the mask layer 120 to expose the remaining sacrificial material layer 110b.

The sacrificial layer 110 may be configured to shelter the top of each fin 101 to reduce the ion implantation dose received by the top of each fin 101. In one embodiment, the sacrificial material layer 110a may be made of silicon oxide, thus the sacrificial layer 110 may be made of silicon oxide. In certain embodiments, the sacrificial layer 110 may be made of germanium-silicon, or germanium, etc. In other words, the sacrificial layer 110 may include one or more of a silicon oxide layer, a germanium-silicon layer and a germanium layer.

If the thickness of the sacrificial layer 110 is too small, the shielding function may be difficult to achieve during the subsequent ion implantation process and the ion implantation dose received by the top of each fin 101 may be effectively reduced. If the thickness of the sacrificial layer 110 is too large, it is easy to waste materials and to increase fabrication difficulty. A too-thick sacrificial layer 110 may also cause too-small ion implantation dose received by the top of each fin 101, and too-low concentration of doped ions in the top of each fin 101. For example, the thickness of the sacrificial layer 110 may be a half of the depth of the first ion implantation process or the second ion implantation process. In one embodiment, the thickness of the sacrificial layer 110 may be in a range of approximately 1 nm-2 nm.

In one embodiment, after removing the mask layer 120, a thickness portion of the sacrificial layer 110 may be removed. Therefore, when performing the ion implantation process, the sacrificial layer 110 may be used to provide effective shielding function and the top of each fin 101 may receive desired ion implantation dose.

In one embodiment, a protective material layer may be formed before forming the fins 101. A protective layer may be simultaneously formed by etching the protective material layer when forming the fins by the etching process. In certain embodiments, the protective layer may be directly formed on the top of each fin after forming the fins and removing the mask layer 120. Other layers/structures and their arrangements may also be used.

Figure 8:
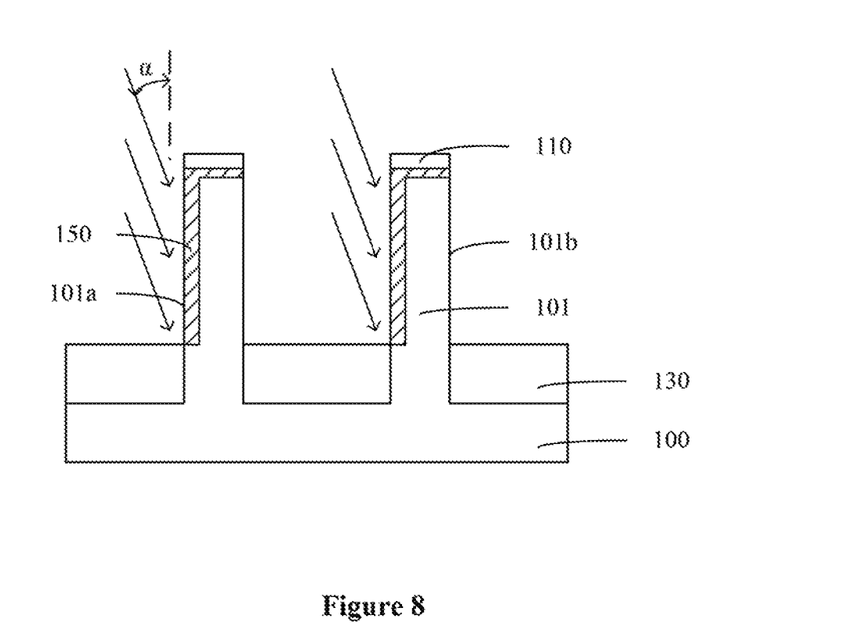

Returning to FIG. 11, after forming the sacrificial layer, a doped layer may be formed (S103). FIGS. 8-9 illustrate corresponding semiconductor structures.

Referring to FIGS. 8-9, a doped layer 150 may be formed in the top and sidewalls of each fin 101 by performing an ion implantation process on each fin 101. In one embodiment, the ion implantation process may be an adjusting ion implantation process configured to adjust the threshold voltage of the formed semiconductor structure. In certain embodiments, the ion implantation process may be any other suitable ion implantation processes configured to achieve other functions, including an anti-punch-through implantation process.

In one embodiment, after forming the sacrificial layer by removing the mask layer and before performing the ion implantation process, a liner layer may be formed to cover the first sidewall 101a and the second sidewall 101b of each fin 101. Therefore, damages and roughness on the surface of each fin 101 may be repaired and the performance of the semiconductor structure may be improved. In addition, the liner layer may smooth the sharp corners on the surfaces of the substrate 100 and the fins 101, and act as a buffer layer between the subsequently formed film layer and the substrate 100 and the fins 101 to reduce the lattice mismatch thereof.

For example, the liner layer may be formed on side surfaces of each fin 101 by a deposition process, or a furnace tube process, etc. The thickness of the sacrificial layer 110 formed on the top of each fin 101 may be larger than the thickness of the liner layer formed on the side surfaces of each fin 101. In one embodiment, the thickness of the liner layer may be smaller than the thickness of the sacrificial layer by approximately 1 nm-2 nm.

Each fin 101 may include the first sidewall 101a and the second sidewall 101b opposing each other and parallel to a length direction of the fin 101. As shown in FIG. 8, performing the ion implantation process on the fins 101 may include performing a first ion implantation process on the top and the first sidewall 101a of each fin 101. The first ion implantation process may implant threshold voltage adjusting ions into the first sidewall 101a of each fin 101 to form a first doped layer of the doped layer 150 in the first sidewall 101a of each fin 101.

The first ion implantation process may simultaneously implant the threshold voltage adjusting ions into the top of each fin 101. Because the sacrificial layer 110 is formed on the top of each fin 101, part of dose implanted into the top of each fin 101 may be sheltered by the sacrificial layer 110. Compared to the existing techniques where the ion implantation process is directly performed on the top of each fin, the dose implanted into the top of each fin 101 may be smaller in the present disclosure.

Referring to FIG. 9, performing the ion implantation process on the fins 101 may include performing a second ion implantation process on the second sidewall 101b of each fin 101. The second ion implantation process may implant the threshold voltage adjusting ions into the second sidewall 101b of each fin 101 to form a second doped layer of the doped layer 150 in the second sidewall 101b of each fin 101.

The second ion implantation process may also simultaneously implant the threshold voltage adjusting ions into the top of each fin 101. Similarly, part of dose implanted into the top of each fin 101 may be effectively sheltered by the sacrificial layer 110. In addition, in one embodiment, the liner layer may be formed on the sidewalls of each fin 101. The thickness of the sacrificial layer 110 may be larger than the thickness of the liner layer. Therefore, the barrier performance of the liner layer on the implantation ions may be weaker than the barrier performance of the sacrificial layer on the implantation ions. Therefore, the dose implanted into the first sidewall 101a of each fin 101 may still be larger than the dose implanted into the top of each fin 101 during the first ion implantation process. The dose implanted into the second sidewall 101b of each fin 101 may still be larger than the dose implanted into the top of each fin 101 during the second ion implantation process.

However, because the top of each fin 101 may receive the ion implantation process twice by the first ion implantation process and the second ion implantation process, concentration of doped ions in the doped layer 150 formed in the top of each fin 101 may be the sum of the two implantation doses. Therefore, the concentration of doped ions in the doped layer 150 formed in the top of each fin 101 may be similar as concentrations of doped ions in each of the first and second doped layer of the doped layer 150 formed in the first sidewall 101a and the second sidewall 101b of each fin 101. Therefore, uniformity of the concentration of doped ions in the doped layer 150 in the sidewalls and top of each fin 101 may be effectively improved, and the performance of the formed semiconductor structure may be improved.

In one embodiment, performing the first ion implantation process and the second ion implantation process may include: using a lateral ion implantation process to perform the first ion implantation process, and using a lateral ion implantation process to perform the second ion implantation process.

For example, performing the first ion implantation process and the second ion implantation process may include: an implantation angle of the first ion implantation process may be in a range of approximately 30°-80° (e.g., angle α in FIG. 8) made with a normal direction to the surface of the substrate; and an implantation angle of the second ion implantation process may be in a range of approximately 30°-80° (e.g., angle β in FIG. 9).

The implantation ions of the first ion implantation process and the second ion implantation process may be related to the type of the semiconductor device formed by the semiconductor structure. When the formed semiconductor structure is used to form a PMOS device, the implantation ions of the first ion implantation process and the second ion implantation process may be N-type ions, such as phosphorus ions, arsenic ions, or antimony ions, etc. When the formed semiconductor structure is used to form an NMOS device, the implantation ions of the first ion implantation process and the second ion implantation process may be P-type ions, such as boron ions, gallium ions, or indium ions, etc.

For example, the implantation depths of the first ion implantation process and the second ion implantation process may be related to the performance of the formed semiconductor structure. In one embodiment, the implantation depths of the first ion implantation process and the second ion implantation process may be less than 10 nm.

Returning to FIG. 1, after forming the doped layer, the sacrificial layer may be removed (S104). FIG. 10 illustrates a corresponding semiconductor structure.

Referring to FIG. 10, after performing the ion implantation process on the fins 101, the sacrificial layer 110 may be removed to expose the top of each fin 101. For example, after performing the ion implantation process, the sacrificial layer 110 may be removed by a thinning process.

Further, after removing the sacrificial layer 110, a corner rounding process may be performed to repair damages on the top and side surfaces of each fin caused by the fabrication processes, and to reduce sharp corners on the top and side surfaces of each fin. For example, in one embodiment, the corner rounding process may include an annealing treatment. For example, the annealing treatment may include a process gas including helium, hydrogen, or a combination thereof, and a process temperature in a range of approximately 600° C.-900° C.

Accordingly, the sacrificial layer may be first formed on the top of each fin, and then the first ion implantation process and the second ion implantation process may be performed on the fins. Because the sacrificial layer is formed on the top of each fin, when performing the first ion implantation process and the second ion implantation process, the sacrificial layer can block part of the implantation dose, thus the implantation dose received by the top of each fin in each ion implantation process may be reduced. Therefore, the concentration of doped ions in the top of each fin subject to the ion implantation process twice may be similar as the concentrations of doped ions in the first sidewall and the second sidewall of each fin subject to the ion implantation process once. Therefore, the uniformity of concentrations of doped ions in the top and sidewalls of each fin may be effectively improved, and the performance of the formed semiconductor structure may be improved.

Various embodiments also include a semiconductor structure. The semiconductor structure may include one or more fins formed on a substrate. Each fin may include a first sidewall and a second sidewall, opposing each other and parallel to a length direction of the fin. An isolation layer is formed between the adjacent fins. A first doped layer is formed at least in the first sidewall of the each fin above the isolation layer. A second doped layer is formed at least in the second sidewall of the each fin above the isolation layer.

Optionally, a top of each fin includes one or more of the first doped layer and the second doped layer, and a concentration of doped ions in the top of each fin is similar with a concentration of doped ions in each of the first sidewall and second sidewall of the each fin.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A method for fabricating a semiconductor structure, comprising:
   providing a base substrate;
   forming a sacrificial material layer on the base substrate;
   forming a mask layer on the sacrificial material layer;
   forming the sacrificial layer and the fins using the mask layer as a mask to etch the sacrificial material layer and the base substrate;
   removing the mask layer, wherein each fin includes a first sidewall and a second sidewall opposing each other;

removing a thickness portion of the sacrificial layer;
performing a first ion implantation process on the first sidewall and a top of the fin; and
performing a second ion implantation process on the second sidewall and the top of the fin.

2. A method for fabricating a semiconductor structure, comprising:
providing a base substrate;
forming a sacrificial material layer on the base substrate;
forming a mask layer on the sacrificial material layer;
forming the sacrificial layer and the fins using the mask layer as a mask to etch the sacrificial material layer and the base substrate;
removing the mask layer, wherein each fin includes a first sidewall and a second sidewall opposing each other;
forming a liner layer covering the first sidewall and the second sidewall of each fin, wherein a thickness of the sacrificial layer is larger than a thickness of the liner layer;
performing a first ion implantation process on the first sidewall and a top of the fin; and
performing a second ion implantation process on the second sidewall and the top of the fin.

3. The method according to claim 2, wherein forming the liner layer on the first sidewall and the second sidewall includes one of:
a deposition process and a furnace tube process.

4. The method according to claim 2, wherein:
the thickness of the liner layer is smaller than the thickness of the sacrificial layer by approximately 1 nm-2 nm.

5. The method according to claim 1, wherein the first ion implantation process and the second ion implantation process include:
using a lateral ion implantation process to perform the first ion implantation process; and
using a lateral ion implantation process to perform the second ion implantation process.

6. The method according to claim 1, wherein each of the first ion implantation process and the second ion implantation process includes:
an implantation angle in a range of approximately 30°-80°.

7. The method according to claim 1, wherein forming the mask layer includes:
a multiple patterning process including a self-aligned double patterned (SaDP) process, a self-aligned triple patterned (SaTP) process, or a self-aligned double patterned (SaDDP) process.

8. The method according to claim 1, wherein:
the mask layer includes at least one silicon nitride layer.

9. The method according to claim 1, wherein each of the sacrificial material layer and the mask layer is formed by one of:
a chemical vapor deposition process, a physical vapor deposition process, an atomic layer deposition process, and a furnace tube process.

10. The method according to claim 1, after forming the substrate and before forming the sacrificial layer, further including:
filling a space between adjacent fins with an isolation layer.

11. The method according to claim 1, wherein, during the first ion implantation process and the second ion implantation process:
implantation depths of the first ion implantation process and the second ion implantation process are smaller than 10 nm.

12. The method according to claim 1, after performing the first ion implantation process and the second ion implantation process, further including:
removing the sacrificial layer to expose the top of the one or more fins.

13. The method according to claim 12, wherein removing the sacrificial layer includes:
a thinning process.

14. The method according to claim 12, after removing the sacrificial layer, further including:
performing a corner rounding process on the one or more fins.

15. The method according to claim 14, wherein performing the corner rounding process includes:
an annealing treatment using a process gas including helium, hydrogen, or a combination thereof and a process temperature in a range of approximately 600° C.-900° C.

* * * * *